United States Patent
Bai (10) Patent No.: US 8,731,105 B2
(45) Date of Patent: May 20, 2014

(54) MULTI-RATE FILTER AND FILTERING METHOD FOR DIGITAL PRE-DISTORTERS

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/529,342

(22) Filed: Jun. 21, 2012

(65) Prior Publication Data

US 2013/0251065 A1    Sep. 26, 2013

Related U.S. Application Data

(60) Provisional application No. 61/614,271, filed on Mar. 22, 2012.

(51) Int. Cl.
*H04K 1/02* (2006.01)

(52) U.S. Cl.
USPC ........... 375/296; 375/278; 375/285; 398/193; 455/114.3

(58) Field of Classification Search
None
See application file for complete search history.

(56) References Cited

U.S. PATENT DOCUMENTS 6,389,078 B1 * 5/2002 Hessel et al. ............. 375/259
2009/0302940 A1 * 12/2009 Fuller et al. ............. 330/149

OTHER PUBLICATIONS

Mkadem et al. "Physically Inspired Neural Network Model for RF Power Amplifier Behavioral Modeling and Digital Predistortion" EmRG Research Group, Dep. of Electrical and Computer Engineering, University of Waterloo, ON N2L-3G1 Canada. Manuscript received Jul. 2, 2010 and revised Oct. 2010. consisting of 12-pages.

* cited by examiner

*Primary Examiner* — Adolf Dsouza
(74) *Attorney, Agent, or Firm* — Christopher & Weisberg, P.A.

(57) ABSTRACT

A method and apparatus for modeling distortion of a non-linear device are disclosed. A pre-distorter model has a plurality of branches. Each branch receives a different output basis function signal. At least one branch includes a down-sampler, a memory structure and an up-sampler. The down-sampler down-samples the received output basis function signal received by the branch by a factor of $1/M_k$, where $M_k$ is different for each of the at least one branches. The memory structure includes at least one delay element to delay the output of the down-sampler according to a predetermined delay. The memory structure has an output based on an output of the at least one delay element. The up-sampler up-samples the output of the memory structure by the up-sampling factor, $M_k$.

18 Claims, 10 Drawing Sheets

MULTI-RATE FILTER AND FILTERING METHOD FOR DIGITAL PRE-DISTORTERS

CROSS-REFERENCE TO RELATED APPLICATION

This application is related to and claims priority to U.S. Provisional Patent Application Ser. No. 61/614,271, filed Mar. 22, 2012, entitled A MULTI-RATE FILTER AND FILTERING METHOD, the entirety of which is incorporated herein by reference.

TECHNICAL FIELD

The present invention relates to modeling non-linear electronic devices and, more particularly, to methods and apparatus for pre-distorting a signal to compensate for distortion subsequently introduced to the signal by a non-linear electronic device.

BACKGROUND

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, digital pre-distortion is applied to the signal at baseband frequencies, i.e., before the signal is up-converted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

A problem encountered in pre-distortion architectures is a memory effect phenomenon in which the current output of a power amplifier is a result of previous inputs. This memory effect arises due to the physical interactions of the components of the power amplifier as well as temperature variations. The previous inputs that affect a current output of the power amplifier may have been received in past picoseconds, nanoseconds, microseconds, milliseconds, or even seconds. Such a wide range of memory effects are difficult to model, and typically result in complex memory models that may be relatively costly to implement and consume relatively large amounts of memory.

Thus, there is a need for a memory structure in a pre-distortion architecture that can model a wide range of memory effects exhibited by a non-linear electronic device, with relatively low complexity and low memory consumption as compared with known models.

SUMMARY

The present invention advantageously provides a method and system for modeling distortion of a non-linear electronic device. According to one aspect, the invention provides a pre-distorter memory modeling apparatus having a plurality of branches. Each branch receives a different output basis function signal. At least one branch includes a down-sampler, a memory structure and an up-sampler. The down-sampler down-samples the received output basis function signal received by the branch by a factor of $1/M_k$, where $M_k$ is different for each of the at least one branch. The memory structure includes at least one delay element to delay the output of the down-sampler according to a corresponding predetermined delay. The memory structure has an output based on an output of the at least one delay element. The up-sampler up-samples the output of the memory structure by the up-sampling factor, $M_k$.

According to another aspect, the invention provides a method of calculating a distortion signal $d(n)$. An input signal $x(n)$ is received and supplied to K branches. In each of the K branches, the input signal $x(n)$ is operated on by a different basis function to produce in each branch an output signal $u_k(n)$ which is different for each branch. In each branch, a signal $u_k$ is applied to a memory model that is different for each branch. The memory model of a branch includes down-sampling, filtering and up-sampling. Thus, $u_k(n)$ is down-sampled by a factor $1/M_k$ to produce a down-sampled signal $v_k(n)$. The down-sampled signal $v_k(n)$ is filtered by a filter having at least one delay element to produce a filtered output. The filtered output is up-sampled by the factor $M_k$ to produce a distortion component $d_k(n)$ that is output by the branch. The outputs $d_k(n)$ of the K branches are added to produce the distortion signal $d(n)$.

According to another aspect, the invention provides a pre-distorter memory module, having a register and accumulator arranged to low-pass filter and down-sample an input signal to produce a down-sampled output signal. A filter having at least one delay element filters the down-sampled output signal to produce a filtered output. The pre-distorter memory module has an interpolator to up-sample the filtered output. The interpolator has a first delay element and a first multiplier to multiply an output of the first delay element by a first factor. The interpolator also has a second delay element and a second multiplier to multiply an output of the second delay element by a second factor. An adder adds the output of the first multiplier to the output of the second multiplier.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Before describing in detail exemplary embodiments that are in accordance with the present invention, it is noted that the embodiments reside primarily in combinations of apparatus components and processing steps related to compensating for distortion in a non-linear electronic device. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 1:
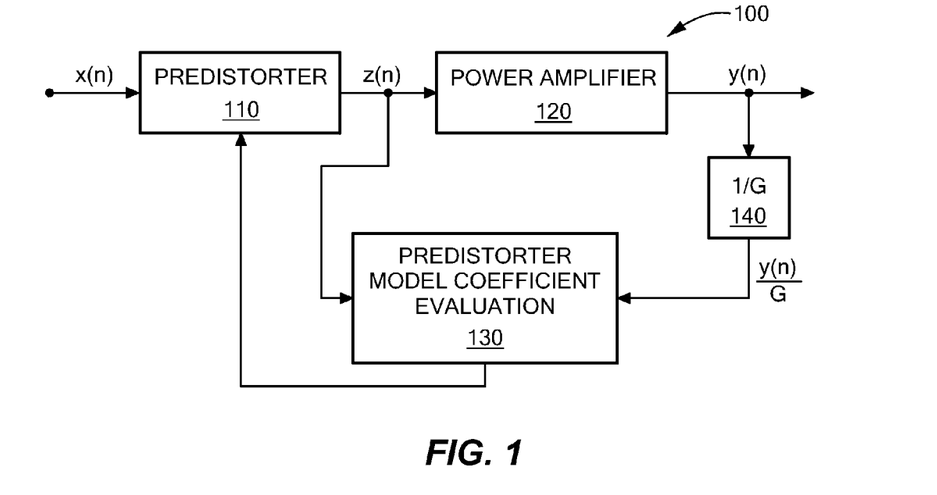
FIG. 1 is a block diagram of an exemplary indirect-learning architecture for a pre-distortion circuit constructed in accordance with principles of the present invention.

Referring now to the drawing figures, in which like reference designators denote like elements, there is shown in FIG. 1, an exemplary pre-distortion system 100 constructed in accordance with principles of the present invention that includes a pre-distorter 110 that is configured to compensate for distortion introduced to a communication signal by a power amplifier 120. As noted above, a power amplifier is typically most efficient when it is operated in a non-linear range. However, the non-linear response of a power amplifier causes unwanted out-of-band emissions and reduces spectral efficiency in a communication system. In the system 100 of FIG. 1, the pre-distorter 110 is used to improve the power amplifier's efficiency and linearity by "pre-distorting" the power amplifier's input signal to compensate for the non-linear distortion introduced by the power amplifier 120. The cascading of the pre-distorter 110 and power amplifier 120 improves the linearity of the output signal, even while power amplifier 120 is operated at high efficiency.

Although pre-distortion is used in the circuits and systems described herein to linearize the output of a power amplifier 120, those skilled in the art will appreciate that the techniques described herein are applicable to characterizing and/or compensating for distortion caused by any type of non-linear electronic device.

As seen in the pre-distortion system 100 of FIG. 1, an input signal $x(n)$ is input to the pre-distorter 110. The pre-distorter 110 pre-distorts the input signal $x(n)$ to compensate for the distortion introduced by the power amplifier 120 when the power amplifier 120 is operated in its non-linear range. The pre-distorted input signal $z(n)$ generated by the pre-distorter 110 is applied to the input of the power amplifier 120, which amplifies the pre-distorted input signal $z(n)$ to produce an output signal $y(n)$. If the pre-distorter 110 is properly designed and configured, then the output signal $y(n)$ contains fewer distortion products and out-of-band emissions than if the power amplifier 120 were used alone.

To compensate for the distortion introduced by the power amplifier 120, the pre-distorter 110 must have a non-linear transfer function that effectively reverses the non-linear effects of the power amplifier 120. To properly configure the pre-distorter 110, an appropriate model for this non-linear transfer function is created. Two different approaches to deriving this non-linear transfer function are possible. The first approach utilizes an indirect-learning architecture, as depicted in FIG. 1. The second uses the direct-learning architecture of FIG. 2.

In both cases, the signal $z(n)$ input to power amplifier 120 and a scaled version of the power amplifier output signal $y(n)$ is applied to a distortion modeling circuit. In the indirect-learning architecture of FIG. 1, this distortion modeling circuit includes a pre-distorter model coefficient evaluation block 130. In the direct-learning architecture of FIG. 2, the distortion modeling circuit has two functional blocks: a power amplifier model coefficient evaluation block 210 and a pre-distorter model coefficient derivation block 220. Note that as used herein, a model refers to the hardware, or combination of hardware and software used to implement pre-distortion in an input signal, or to model such pre-distortion.

Figure 2:
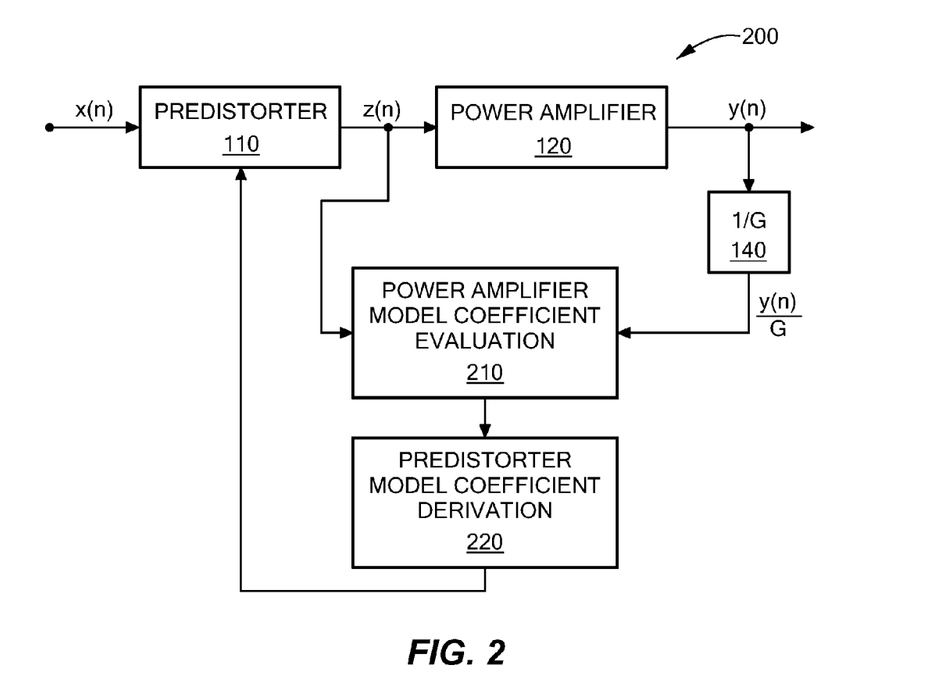
FIG. 2 is a block diagram of an exemplary direct-learning architecture for a pre-distortion circuit constructed in accordance with principles of the present invention.

In either case, the scaling of the power amplifier signal, illustrated as the attenuator 140 in FIGS. 1 and 2, reflects the net linear gain G that is desired from the combination of the pre-distorter 110 and the power amplifier 120. Scaling the output signal $y(n)$ by the inverse of G permits the non-linearities introduced by the power amplifier 120 to be analyzed independently from its gain.

In the indirect-learning architecture of FIG. 1, a general structure for a model of the pre-distorter 110 is assumed, and the pre-distorter model's coefficients (parameters) are estimated directly from the input and outputs of the power amplifier 120. Thus, the pre-distorter modeling circuit 130 evaluates the amplifier input signal $z(n)$ and the scaled amplifier output signal $y(n)/G$ according to a predetermined non-linear model for the pre-distorter 110 to directly determine a set of weighting coefficients to be applied by the pre-distorter 110. In this indirect approach, a model for the power amplifier 120 is not derived. Rather, the non-linear characteristics of the power amplifier 120 are learned indirectly, through the modeling of the pre-distortion needed to counteract the distortion introduced by the power amplifier 120.

In contrast, the direct-learning architecture of FIG. 2 directly characterizes the non-linear performance of the power amplifier 120. First, the power amplifier modeling circuit 210 evaluates the amplifier input signal $z(n)$ and the amplifier output signal $y(n)/G$ according to a predetermined non-linear model for the power amplifier 120. The weighting coefficients that best fit the power amplifier's non-linear characteristics to the power amplifier model in block 120 are then used by coefficient derivation circuit 220 to generate weights for configuring the pre-distorter 110.

In the direct-learning architecture, the distortion introduced by the power amplifier 120 is typically represented by a complicated non-linear function, which is referred to herein as the distortion function. In the indirect-learning architecture, the response of the pre-distorter 110 is represented by a similar non-linear distortion function. In either case, one approach to modeling the distortion function, referred to herein as the decomposition approach, is to decompose the distortion function into a set of less complicated basis functions, each of which separately acts on the input signal. The output of the distortion function is then modeled as the weighted sum of the basis function outputs. The set of basis functions used to model the distortion function is referred to herein as the basis function set.

Figure 3:
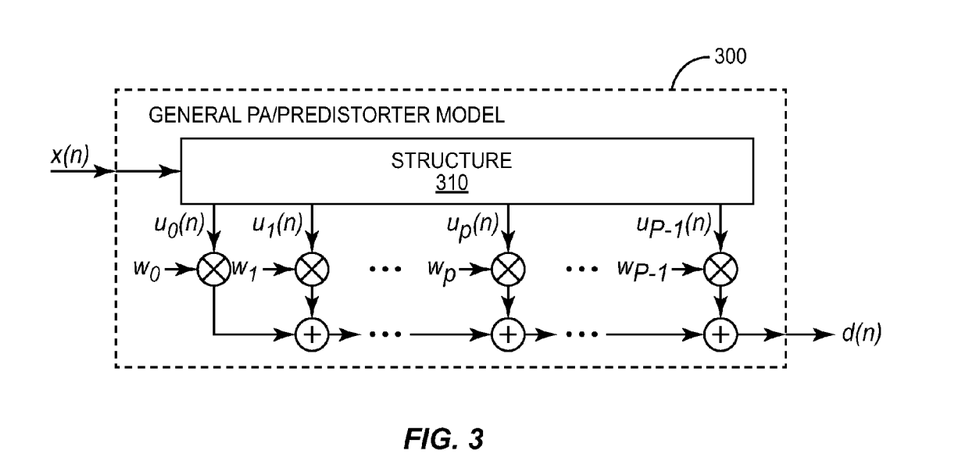
FIG. 3 is a block diagram of an exemplary generic distortion model for modeling distortion introduced by a predistorter or power amplifier constructed in accordance with principles of the present invention.

FIG. 3 illustrates a generalized multi-branch distortion model 300, which may represent the distortion introduced by the power amplifier 120 e.g., as modeled by model coefficient evaluation unit 210 in the direct learning architecture of FIG. 2 or the pre-distortion transfer function of the pre-distorter 110 e.g., as modeled by the pre-distorter model coefficient evaluation unit 130 of FIG. 1. In other words, the pre-distortion model 300 may be implemented by the pre-distorter block 110 and the coefficient evaluation unit 130 of FIG. 1 and the coefficient evaluation unit 210 of FIG. 2. In either case, the distortion model 300 has a structure 310 having P output taps, labeled $u_0(n)$ to $u_{P-1}(n)$. Each of these output taps represents an operation on the input signal x(n), where the operations may correspond to a predetermined basis function set, as discussed in further detail below.

The model structure 310 operates on the input signal x(n) to produce data samples $\{u_0(n), u_1(n), \ldots u_{P-1}(n)\}$. The distortion model 300 then computes a weighted sum of the data samples $\{u_0(n), u_1(n), \ldots u_{P-1}(n)\}$ to obtain a distorted signal d(n). More specifically, the data samples $\{u_0(n), u_1(n), \ldots u_{P-1}(n)\}$ are multiplied by corresponding weighting coefficients $\{w_0(n), w_1(n), \ldots w_{P-1}(n)\}$, and the resulting products are added together to obtain d(n).

The distortion model shown in FIG. 3 can be represented by:

$$d(n) = \sum_{p=0}^{P-1} w_p u_p(n). \quad \text{Eq. 1}$$

Equation 1 can be written as a linear equation according to:

$$d(n) = u^T(n)w, \quad \text{Eq. 2}$$

where u(n) is a P×1 vector of data samples output by the structure at time n, and where w is a P×1 vector of the weighting coefficients.

For a given vector u(n), d(n) is the desired output of the model (e.g., the actual output of the power amplifier 120, in the direct-learning architecture, or the desired output of the pre-distorter 110, in the indirect-learning architecture). The weighting coefficients w that best fit the vector u to the desired output d(n) over a period of time can be learned by fitting multiple observations of u to the corresponding desired outputs d(n). Thus, for a set of observations taken at N sampling instances, the corresponding linear equations given by Equation 2 can be expressed as:

$$U \cdot w = d \quad \text{Eq. 3}$$

where U is an N×P matrix of data signals and d is the desired output signal vector of the distortion model. The columns of the matrix U correspond to the data samples output by the structure 130, while each row of the matrix corresponds to a different sampling instance. Equation 3 can be evaluated according to well known techniques e.g., to minimize a criterion such as a least-square-error criterion to find the weights w that best model the distortion of the power amplifier 120 or the pre-distorter 110.

Figure 4:
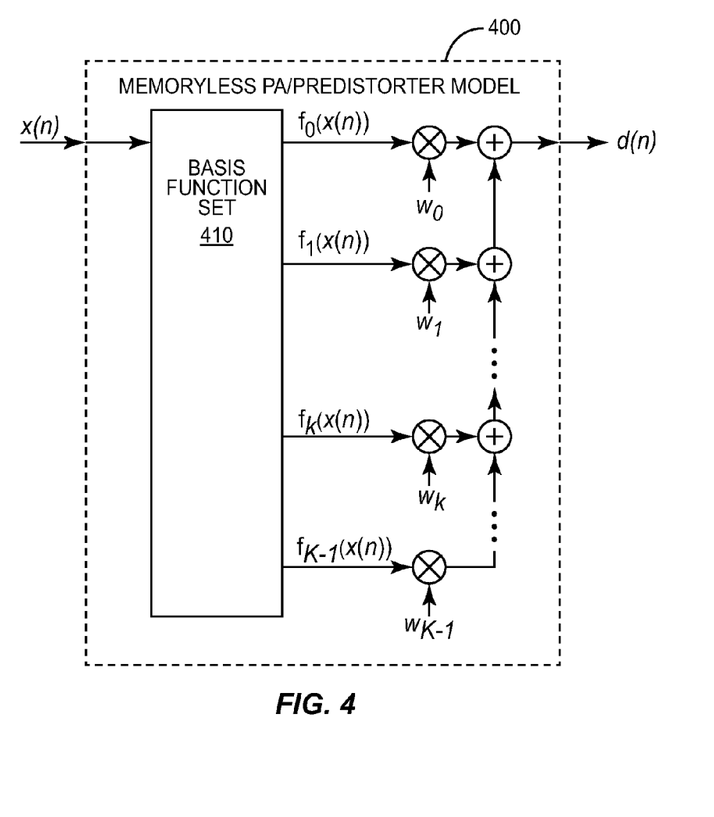
FIG. 4 is a block diagram of an exemplary memorials distortion model for modeling distortion introduced by a pre-distorter or power amplifier constructed in accordance with principles of the present invention.

FIG. 4 is a block diagram of an exemplary embodiment of a memoryless, multi-branch distortion model 400 for modeling a distortion function, as may be implemented by the pre-distorter 110 and the coefficient evaluation block 130, 210. In distortion model 400, the basic structure of the model is determined by a basis function set 410 having multiple basis functions. Each of the K branches in the model corresponds to one of these basis functions, which each operates on the input signal x(n) and which are represented in FIG. 4 as $f_0(x(n))$ to $f_{K-1}(x(n))$. In this memoryless model, these functions each operate only on a present sample x(n) of the input signal, and thus are "memoryless" functions. Like the functions u(n) in the more general model illustrated in FIG. 3, each of the basis function output signals $\{f_0(x(n)), f_1((x(n)), \ldots f_{K-1}(x(n))\}$ are multiplied by corresponding weighting coefficients $\{w_0(n), w_1(n), \ldots w_{K-1}(n)\}$ and added together to obtain d(n).

A difference between the models of FIG. 3 and FIG. 4 is that the functions $f_0(x(n))$ to $f_{K-1}(x(n))$ in FIG. 4 are constrained to be memoryless. Thus, the model of FIG. 4 can be viewed as a special case of the model of FIG. 3, where each of the functions $f_0(x(n))$ to $f_{K-1}(x(n))$ corresponds to one of the functions $\{u_0(n), u_1(n), \ldots u_{P-1}(n)\}$ in FIG. 3. Accordingly, the weights w that best model the distortion of the power amplifier 120 or the pre-distorter 110 can be found in a similar manner to that described above, e.g., by fitting a matrix of N observations of the outputs of basis function set 410 to a desired output signal vector d. Of course, because the model 400 does not account for memory effects, the accuracy of this model relative to the actual distortion function of a given power amplifier may be less than the accuracy of an embodiment that does account for memory effects.

Figure 5:
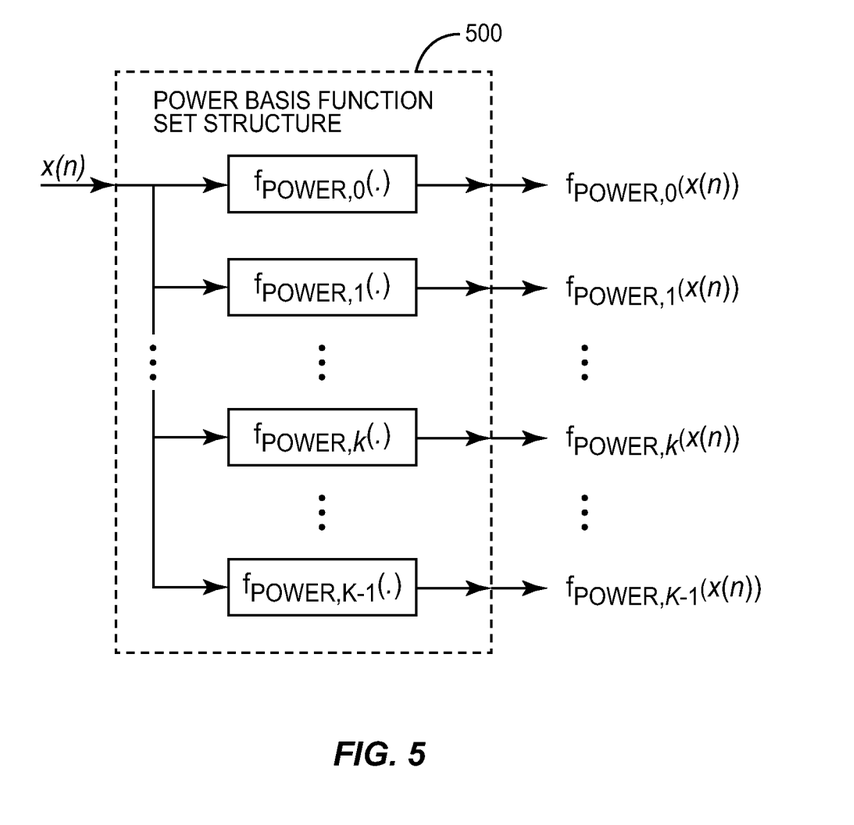
FIG. 5 is a block diagram of an exemplary basis function set structure based on the use of power functions constructed in accordance with principles of the present invention.

In some embodiments of this model, the basis function set 410 may include a set of power functions. This is illustrated in FIG. 5, where basis function set 500 has K outputs designated $f_{POWER,0}(x(n))$ to $f_{POWER,K-1}(x(n))$, where $f_{POWER,k}(x(n))=x(n)|x(n)|^k$. If the power basis function set 500 of FIG. 5 is used to model a distortion transfer function, then the basis function set 500 corresponds to the basis function set 410 of FIG. 4 and structure 310 of FIG. 3. Thus, the data samples $\{u_0(n), u_1(n), \ldots u_{P-1}(n)\}$ correspond to the outputs from the power basis functions $\{f_{POWER,0}(x(n)), f_{POWER,1}(x(n)), \ldots f_{POWER,K-1}(x(n))\}$ (where P=K). A matrix U, having N observations of the outputs of the power basis function set 500, can be formed and fitted to a desired output signal vector d to determine the weighting coefficients w that most closely model the desired distortion function.

Figure 6:
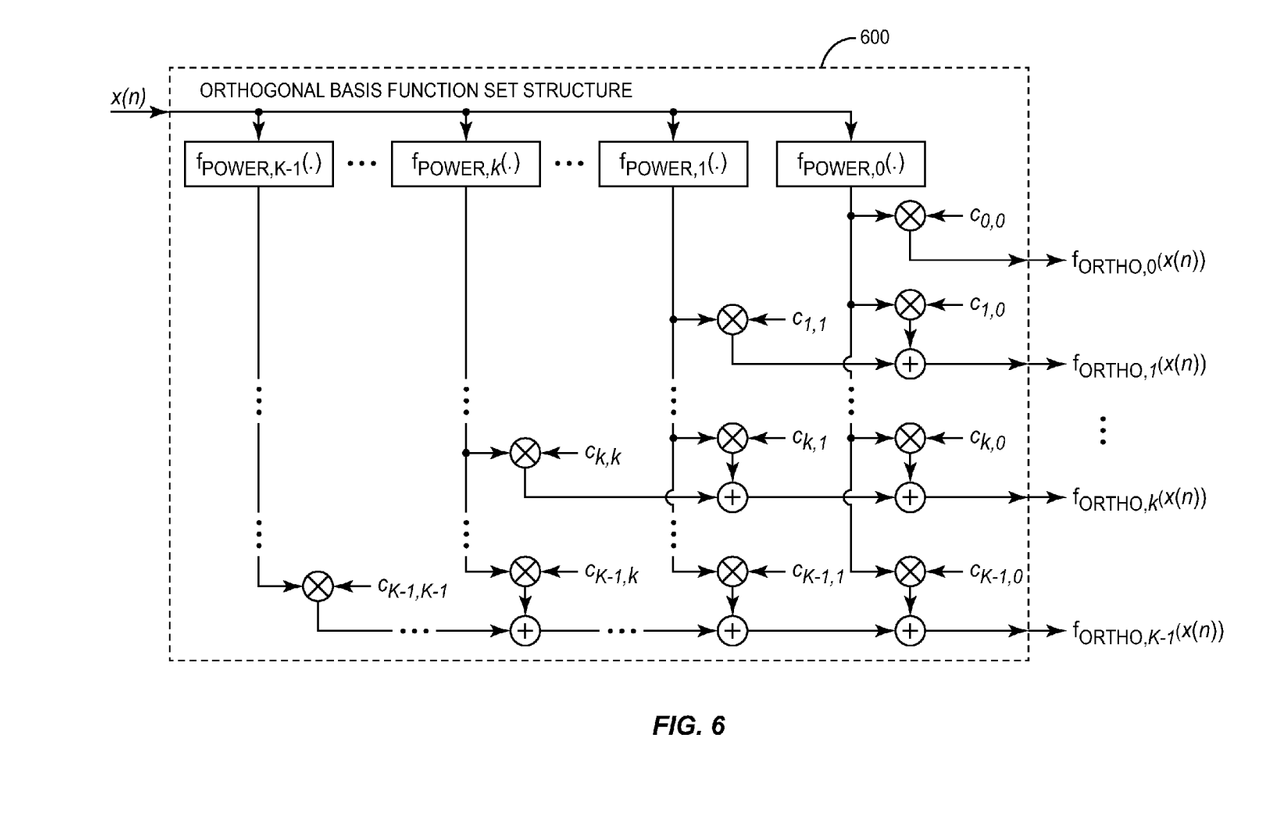
FIG. 6 is a block diagram of an exemplary orthogonal basis function set structure for modeling distortion constructed in accordance with principles of the present invention.

An orthogonal basis function set can be constructed as a weighted summation of the power basis functions. An orthogonal basis function set can be advantageous in many applications, as an orthogonal basis function set can provide better numerical stability during the matrix mathematics used to evaluate weighting coefficients for the distortion models than a non-orthogonal basis function set. FIG. 6 illustrates the basis function structure 600 for an orthogonal basis function set, where the outputs $f_{ORTHO,0}(x(n))$ to $f_{ORTHO,K-1}(x(n))$ correspond to the output samples $\{u_0(n),$ $u_1(n), \ldots u_{p-1}(n)$} of the general model 300 of FIG. 3. In this case, each data sample $u_k(n)$ can be expressed as:

$$u_k(n) = f_{ORTHO,k}(x(n)) = \sum_{h=0}^{k} c_{k,h} f_{POWER,h}(x(n)) \quad \text{Eq. 4}$$

where the subscript 'ORTHO,k' of the tap function $f_{ORTHO,k}(x(n))$ denotes an orthogonal basis function of the k-th order. Each connection coefficient $c_{k,h}$ is the weight for the h-th order power basis function, $f_{POWER,h}(x(n))$, used in the summations of FIG. 6 to obtain the k-th order orthogonal basis function, $f_{ORTHO,k}(x(n))$. A given ensemble of coefficients $c_{k,h}$ identifies a particular orthogonal basis function set (as given by Equation 4).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
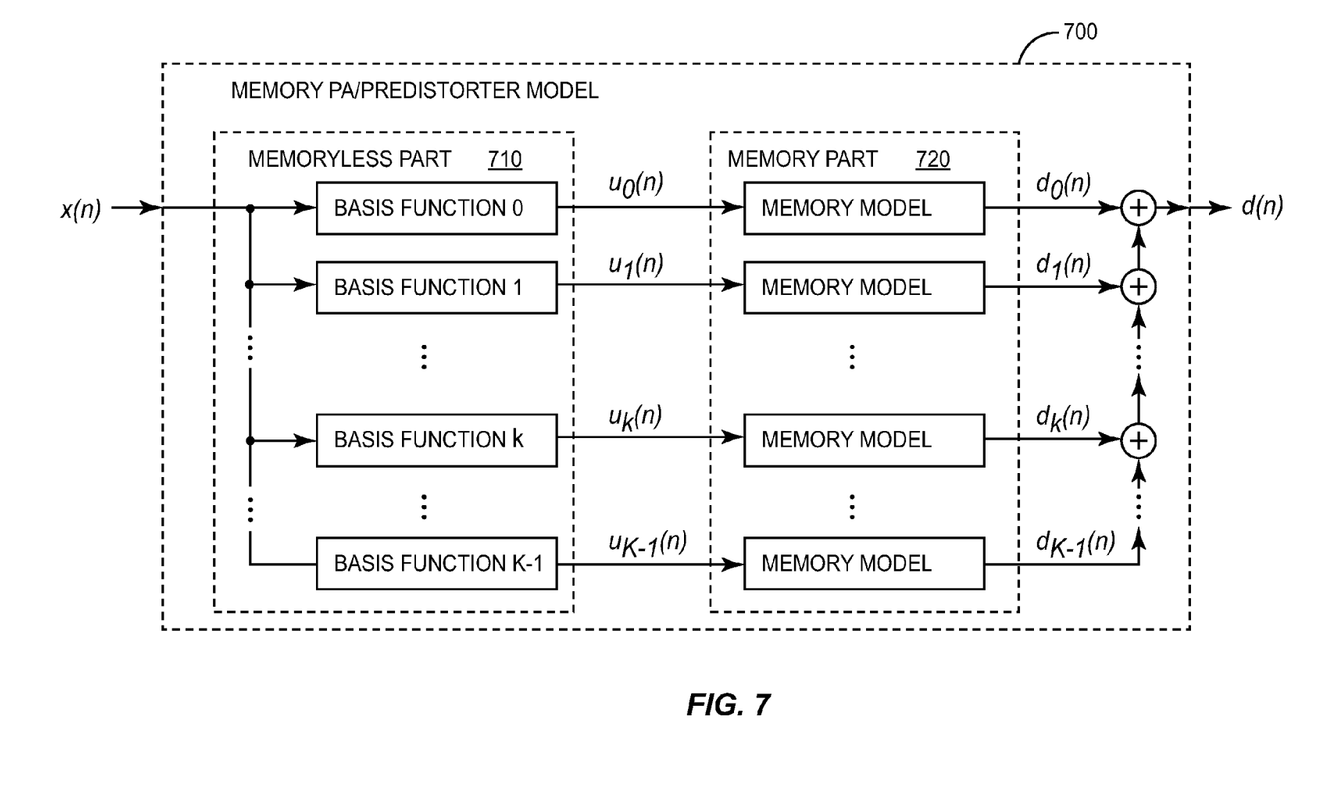
FIG. 7 is a block diagram of an exemplary pre-distortion model that includes a memoryless part and a memory part constructed in accordance with principles of the present invention.

Memory effects, i.e., the dependence of an output signal on prior states of the input signal as well as on the present state, can also be incorporated into a distortion function. FIG. 7 is a block diagram of an exemplary non-linear distortion model 700 that includes memory. In FIG. 7, the model is divided into a memoryless part 710 and a memory part 720, where the memory part 720 models memory effects corresponding to each of the K basis functions. Accordingly, the basis functions in each of the K branches in the memoryless part 710 supply basis function output signals to corresponding memory models in the memory part 720. The output from each memory model can generally be viewed as a weighted sum of the basis function output signal and/or delayed versions of the basis function output signal. For example, if the basis function for branch k is $f_k(\bullet)$ and the input signal is $x(n)$, then the output of branch k is a weighted sum of $f_k(x(n))$, $f_k(x(n-1))$, $f_k(x(n-2))$, etc. The K outputs from the K branches are summed to form the desired distortion signal $d(n)$.

Figure 8:
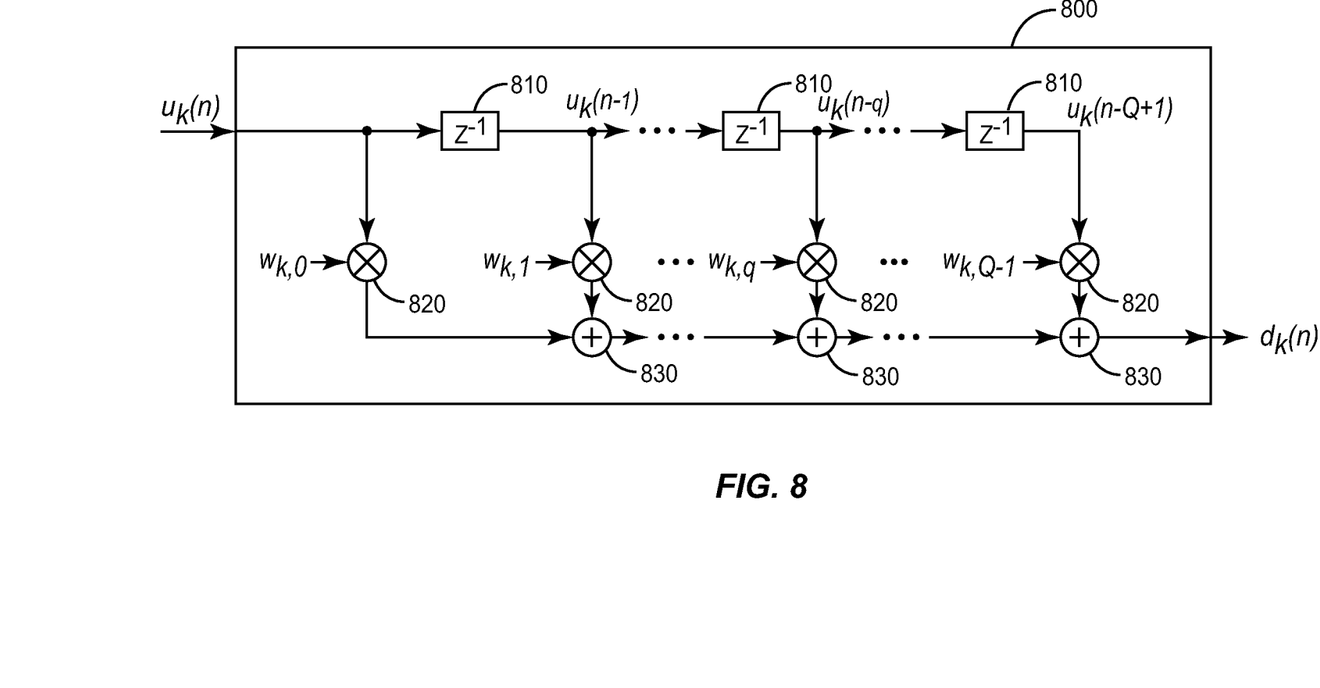
FIG. 8 is a block diagram of an exemplary memory model based on a tapped delay line with unit delays constructed in accordance with principles of the present invention.

The memory models in memory part 720 may have any of a variety of structures. One possible structure, a tapped delay line model with unit delays, is illustrated in FIG. 8. The memory model 800 corresponds to a single one of the memory models in the memory part 720 of FIG. 7. Thus, a K-branch distortion model using the tapped delay line memory model 800 of FIG. 8 would include K instances of the memory model 800.

In the tapped-delay-line memory model structure in FIG. 8, delay elements 810 (labeled with $Z^{-1}$) represent unit delays. Thus, if the input to the memory model 800 is a present sample $u_k(n)$ of the input signal, then the output of the leftmost delay element 810 is the most recent previous sample of the input signal, i.e., $u_k(n-1)$. The output of the next delay element 810 to the right is the sample prior to that one, i.e., $u_k(n-2)$. This continues through the Q-1 delay elements 810. Thus, the memory model 800 of FIG. 8 is said to have a memory depth of Q.

Each of the Q "taps" in the memory model 800, i.e., the data samples $u_k(n)$ to $u_k(n-Q+1)$, are multiplied by corresponding weights $w_{k,0}$ to $w_{k,Q-1}$, with multipliers 820. The resulting products are summed together, with adders 830, to form a branch output signal $d_k(n)$. Referring to FIG. 7, the branch output signals $d_k(n)$ are summed to form the desired distortion signal $d(n)$. The structure depicted in FIG. 8 can be represented by the following equation:

$$d_k(n) = \sum_{q=0}^{Q-1} w_{k,q} u_k(n-q). \quad \text{Eq. 5}$$

In the tapped-delay-line memory model of FIG. 8, a distinct memory function can be applied to each basis function output signal $u_k$. By configuring the weights $w_{k,q}$, any arbitrary weighted sum of the basis function output signal $u_k$ and earlier samples of the basis function output signal can be formed, up to the memory depth of Q. This allows a great deal of flexibility in modeling the memory effects of an electronic device. Q is typically chosen to ensure that that the time interval covered by Q consecutive samples is sufficient to span the most significant memory effects of the modeled distortion transfer function.

Figure 9:
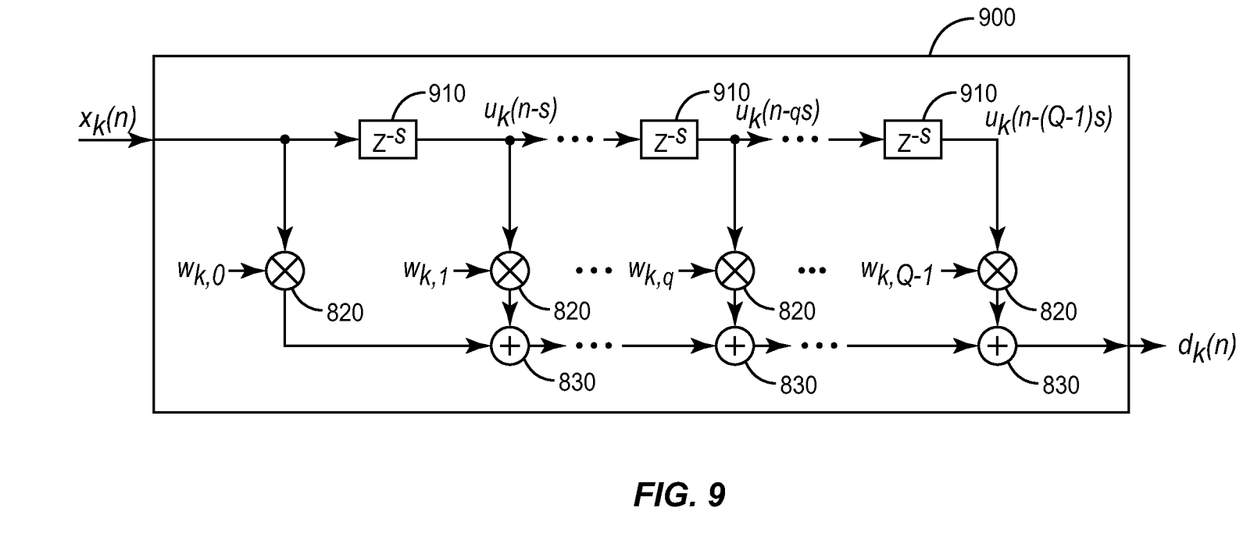
FIG. 9 is a block diagram of an exemplary memory model based on a tapped delay line with non-unit delays constructed in accordance with principles of the present invention.

Another exemplary memory model structure is shown in FIG. 9. The memory model 900 has a tapped-delay-line structure similar to the memory model 800. However, instead of the unit-delay elements 810 of FIG. 8, the memory model 900 includes several non-unit delay elements 910. These non-unit delay elements 930 are labeled $Z^{-s}$, indicating that each non-unit delay element delays its input signal by s sampling intervals, where s>1. If s=1, then the memory model 900 would be identical to the memory model 800. The structure depicted in FIG. 9 can be represented by the following equation:

$$d_k(n) = \sum_{q=0}^{Q-1} w_{k,q} u_k(n-qs) \quad \text{Eq. 6}$$

This structure allows longer memory effects to be modeled, compared to a unit-delay tapped-delay line structure having the same number of taps. However, the resulting model will have less resolution in the time domain.

Figure 10:
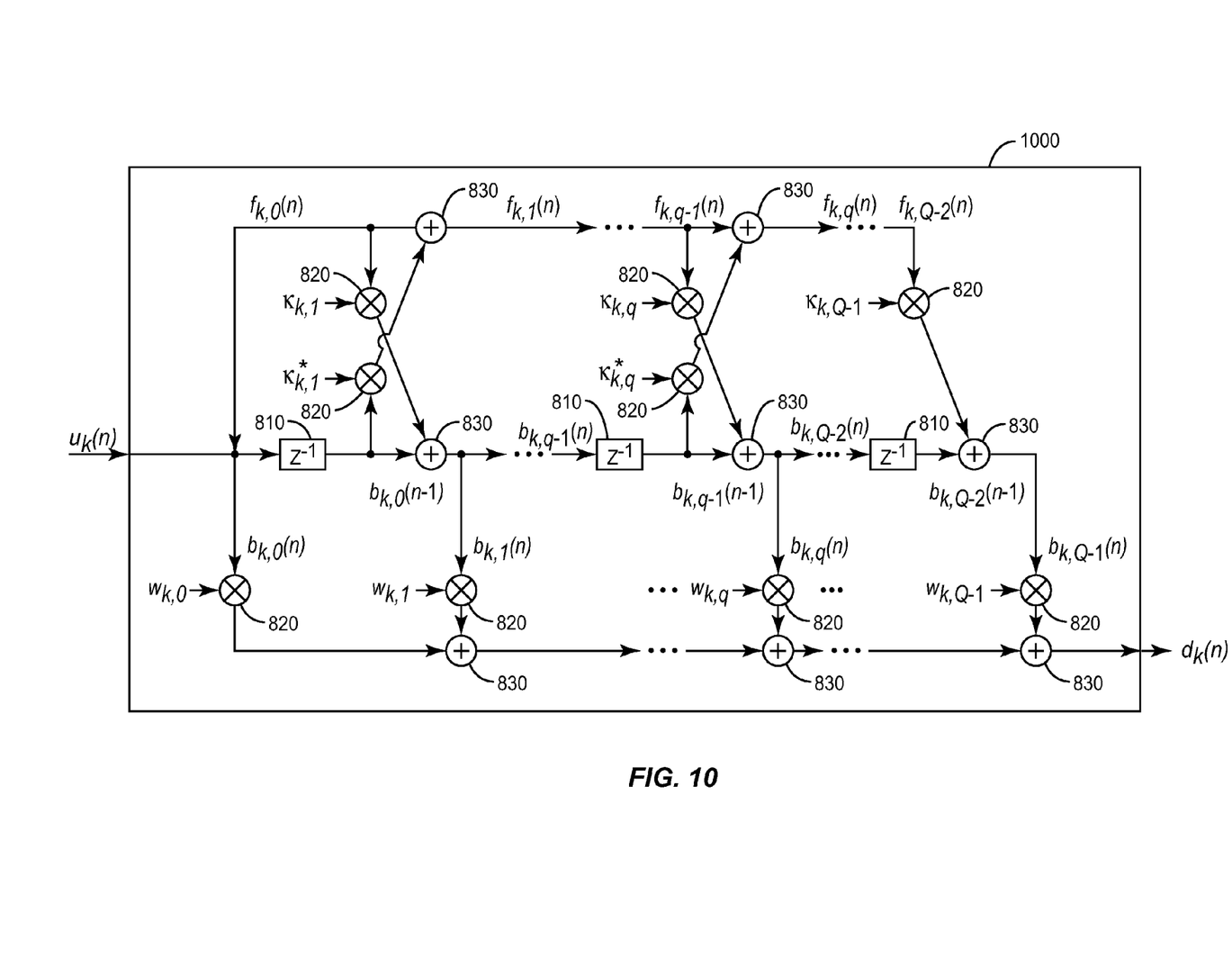
FIG. 10 is a block diagram of an exemplary memory model based on a predictive lattice with unit delays constructed in accordance with principles of the present invention.

Still another memory model structure is shown in FIG. 10, which illustrates a lattice predictor memory model 1000. In the lattice predictor memory model 1000, $f_{k,q}(n)$ and $b_{k,q}(n)$ are the q-th order forward and backward prediction errors, respectively, at time n. $\kappa_{k,q}$ is the q-th order reflection coefficient, and the superscript '*' denotes the conjugate transpose operation. It should be noted that, in the predictive lattice memory model structure, the backward prediction error of a given order is delayed by one time unit, through unit-delay elements 810, before being used to evaluate the backward prediction error of the next order.

The structure depicted in FIG. 10 can be represented by the following algorithm:

1. q=0 (initialization):

$$f_{k,0}(n) = b_{k,0}(n) = u_k(n) \quad \text{Eq. 7}$$

2. q=1, ..., Q-2 (first stage to the second-to-last stage):

$$f_{k,q}(n) = f_{k,q-1}(n) + \kappa^*_{k,q} b_{k,q-1}(n-1) \quad \text{Eq. 8}$$

$$b_{k,q}(n) = \kappa_{k,q} f_{k,q-1}(n) + b_{k,q-1}(n-1) \quad \text{Eq. 9}$$

3. q=Q-1 (the last stage; $f_{k,Q-1}(n)$ does not need to be computed):

$$b_{k,Q-1}(n) = \kappa_{k,Q-1} f_{k,Q-2}(n) + b_{k,Q-2}(n-1) \quad \text{Eq. 10}$$

An estimate $\hat{\kappa}_{k,q}$ of the q-th order reflection coefficient can be evaluated based on a typical set of data of length N using the Burg estimate as:

$$\hat{k}_{k,q} = \frac{2 \sum_{n=m+1}^{N} b_{k,q-1}(n-1) f^*_{k,q-1}(n)}{\sum_{n=m+1}^{N} [|f_{k,q-1}(n)|^2 + |b_{k,q-1}(n-1)|^2]} \quad \text{Eq. 11}$$

Note that in Equation 11, the start value of both summations are set to n=m+1 to exclude zero terms, based on the assumption that $u_k(n)=0$ for n<0.

Each of the distortion models in FIGS. 3-7 includes a set of taps, or data samples, that are weighted and summed to form the "desired" distortion signal d(n), as follows:

$$u^T_{1 \times P}(n) \cdot w = d(n) \quad \text{Eq. 12}$$

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of x(n−1), x(n−2) etc. Note that in Equation 12 and as generally used herein, $(\bullet)^T$ denotes a transpose, $(\bullet)^H$ denotes a conjugate transpose, P is the number of coefficients in the model, the P×1 vector u(n) denotes all of the data samples in the model at a given time index n, the P×1 vector w denotes all the coefficients in the distortion model, and d (n) is the desired output of the model for time instance n.

For any given time index n, both u(n) and d(n) are known, and Equation 12 is a linear equation of w. As noted earlier, for observations obtained on N time indices, the corresponding linear equations expressed in Equation 12 can be compactly expressed as:

$$\underset{N \times P}{U} \cdot \underset{P \times 1}{w} = \underset{N \times 1}{d} \quad \text{Eq. 13}$$

In Equation 13, U is the input data matrix and d is the desired output vector.

In the indirect-learning architecture of FIG. 1, d(n) is the desired output of the pre-distorter 110, which ideally has a distortion function that compensates for the distortion introduced by power amplifier 120. Thus, d(n) corresponds to z(n), the input to power amplifier 120 when the indirect-learning architecture is used. The input signal to the distortion model, denoted as x(n) in FIGS. 3-7, corresponds to the scaled output of the power amplifier 120, y(n)/G. Thus, for any given model structure, samples of the output from the power amplifier 120 are taken for each of N sampling instances and applied to a set of basis functions to produce a matrix U. This matrix U is fitted to the desired output vector d according to Equation 13, where d is a vector of samples of the input to power amplifier, taken at the same N sampling instances used to form the matrix U.

As discussed earlier, the distortion characteristics for the power amplifier are modeled directly in the direct-learning architecture of FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 13, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in the digital pre-distorter 110 of FIGS. 1 and 2 is the challenge of estimating the coefficient vector w based on Equation 13 satisfying a certain criterion. In order to solve this estimation challenge, inversion of the data matrix U, or $U^H U$, in some form is used. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, a design consideration for a distortion model for a power amplifier or a pre-distorter is to provide the coefficient evaluation algorithm with a data matrix $U^H U$ that has a relatively small number of columns (to reduce the computational complexity of the matrix operations), that has a condition number as close to 1 as possible for high numerical stability, and that at the same time also models the physical behavior of the power amplifier or pre-distorter as exactly as possible, given a particular optimization criteria. One challenge associated with adding memory effects to conventional distortion models is the extra instability added to the coefficient evaluation process due to the introduction of the memory model terms in the model. This challenge exists for both the direct and indirect learning architectures.

This added instability is reflected in a significant increase, sometimes as much as by a factor of $10^6$, of the condition number of the data matrix that has to be inverted in the parameter evaluation process. This problem can be quite serious in an adaptive digital pre-distortion system with memory, as the parameters in such a system have to be adapted "on the fly" to track the distortion characteristics of the power amplifier over time.

A fundamental source of this added instability is the high correlation among the data samples used in the coefficient evaluations. This is a result of at least two aspects of the digital pre-distorter. First, successive input data samples to the pre-distorter exhibit high correlation with one another due to the significantly over-sampled nature of the input signal to the pre-distorter. This high correlation is a result of the high ratio, at least on the order of 3-5, of the sampling rate to the baseband bandwidth of the input signal. This high over-sampling ratio is due, in turn, to the fact that the pre-distorter is intended, by design, to distort the input signal. This necessarily causes bandwidth expansion. As a result, the signals processed in the pre-distorter system must be sampled at a rate significantly higher than that necessary to capture the information in the original, undistorted signal.

Also, given a tapped delay line structure for the memory model, consecutive input data samples are directly used to create the matrix U that is used for coefficient evaluations. As a result, the data samples used in the coefficient evaluations exhibit high correlation.

Figure 11:
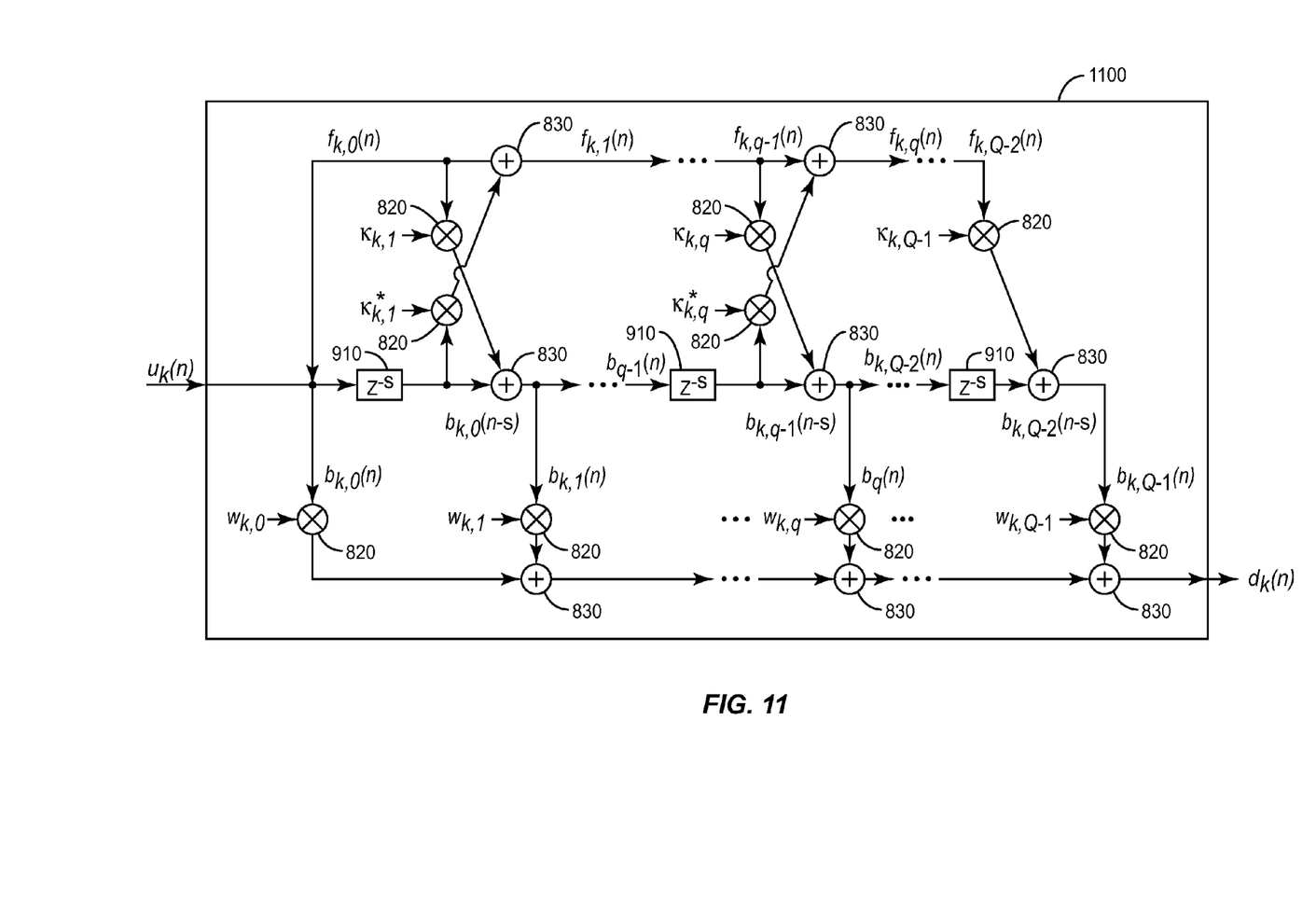
FIG. 11 is a block diagram of an exemplary memory model based on a predictive lattice with non-unit delays constructed in accordance with principles of the present invention.

FIG. 11 illustrates a lattice predictor memory model 1100 that addresses these issues. Lattice predictor memory model 1100 is similar to the model 1000 pictured in FIG. 10, but has non-unit delay elements 910, instead of unit-delay elements.

Thus each of the delay elements 910, labeled $Z^{-s}$, delays its input signal by s sampling intervals, where s>1.

The structure depicted in FIG. 11 can be represented by the following algorithm:

1. q=0 (initialization):

$$f_{k,0}(n) = b_{k,0}(n) = u_k(n) \qquad \text{Eq. 14}$$

2. q=1, ..., Q–2 (first stage to the second-to-last stage):

$$f_{k,q}(n) = f_{k,q-1}(n) + \kappa^*_{k,q} b_{k,q-1}(n-s) \qquad \text{Eq. 15}$$

$$b_{k,q}(n) = \kappa_{k,q} f_{k,q-1}(n) + b_{k,q-1}(n-s) \qquad \text{Eq. 16}$$

3. q=Q–1 (the last stage; $f_{k,Q-1}(n)$ does not need to be computed):

$$b_{k,Q-1}(n) = \kappa_{k,Q-1} f_{k,Q-2}(n) + b_{k,Q-2}(n-s) \qquad \text{Eq. 17}$$

An estimate $\hat{\kappa}_{k,q}$ of the q-th order reflection coefficient can be evaluated based on a typical set of data of length N as:

$$\hat{\kappa}_{k,q} = \frac{2 \sum_{n=m+1}^{N} b_{k,q-1}(n-s) f^*_{k,q-1}(n)}{\sum_{n=m+1}^{N} [|f_{k,q-1}(n)|^2 + |b_{k,q-1}(n-s)|^2]} \qquad \text{Eq. 18}$$

Note that in Equation 18, the start value of both summations are again set to n=m+1 to exclude the zero terms based on the assumption that $u_k(n)=0$ for n<0.

The determination of the number of delays between adjacent taps, i.e., the value of s, in the non-unit-delay lattice predictor memory model is based on the trade-off between two factors. First, an increase in the delay between taps, i.e., an increase in s, results in a reduction of the condition number in the data matrix U, due to the decreased correlation between successive data samples in the matrix. This increases the stability of the mathematical computations that are performed to derive the optimal tap weights. Of course, this improvement is subject to diminishing improvements as s becomes larger. Thus, there is a point after which the benefit in terms of condition number reduction is insignificant.

Second, as with the tapped-delay-line structure, an increase in the delay between taps results in degradation of the model's performance, as manifested in terms of normalized mean square error (NMSE) between the model output and the desired signal.

Furthermore, while the memory model illustrated in FIG. 11 has uniform delays between each tap (each delay element introduces a delay of s sampling intervals), this need not be the case. In some implementations, one or more of the delays introduced by the delay elements 910 in FIG. 11 may vary from the others. For example, one memory model may have several delay elements with unit-interval delays, followed by one or more with multi-unit delays. This approach facilitates the fine-resolution modeling of short-term memory effects, with coarser modeling of longer-term effects. Other configurations of non-uniform delays are also possible. Non-uniform delays may also be applied to the tapped-delay-line memory model of FIG. 9, which has uniform, multi-unit delay intervals.

Figure 12:
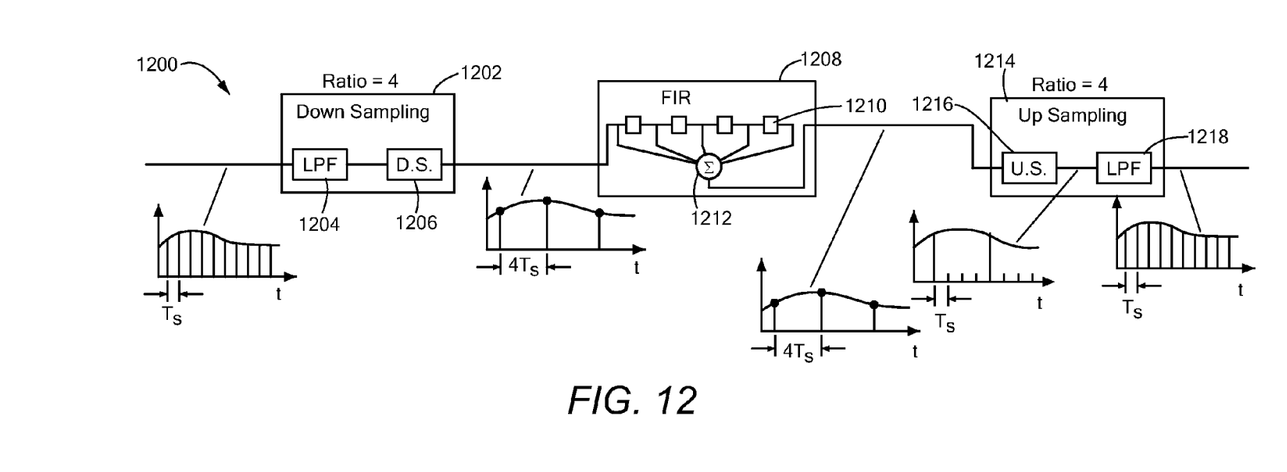
FIG. 12 is a block diagram of an exemplary memory model constructed in accordance with principles of the present invention.

The memory models of FIGS. 8-11, may operate at relatively high sampling rates and may require relatively large amounts of memory. FIG. 12 is an alternative embodiment of a memory model 1200. In FIG. 12, a down-sampling block 1202 includes a low pass filter 1204 and a down-sampler 1206. The down-sampling block 1202 receives a basis function sampled at a high rate, such as for example, 20 MHz, having a small sampling period, Ts=1/20 MHz, and outputs a signal sampled at a low rate, such as for example, 5 MHz, having a larger sampling period of 4Ts=1/5 MHz.

The output of the down-sampling block 1202 is input to a finite impulse response (FIR) filter 1208 having delay elements 1210 and an adder 1212. The FIR filter 1208 may model memory effects on a relatively large time scale, such as for example, seconds or a may model memory effects on a smaller time scale, such as milliseconds, microseconds, nanoseconds or picoseconds, etc. Because the input signal is sampled at a low rate, the delay of each delay element can be relatively large, and fewer delay elements are required. This conserves memory.

The output of the FIR filter 1208 is input to an up-sampling block 1214 which includes an up-sampler 1216 and a low pass filter 1218. In one embodiment, the up-sampler 1216 add zero-valued samples between the received samples, to effectuate a sampling period of Ts between samples. The low pass filter 1218 serves to reject image spectra caused by the up-sampling.

The embodiment of FIG. 12 reduces the amount of memory required to store samples of a memory model. The savings in memory increases with an increase in the evaluation period of the memory model. For example, more memory is conserved for a memory model that models memory effects on the order of seconds and less memory is conserved for a memory model that models memory effects on the order of picoseconds. The output of the memory model 1200 can be added to the outputs of other memory models to produce the distortion signal d(n).

Figure 13:
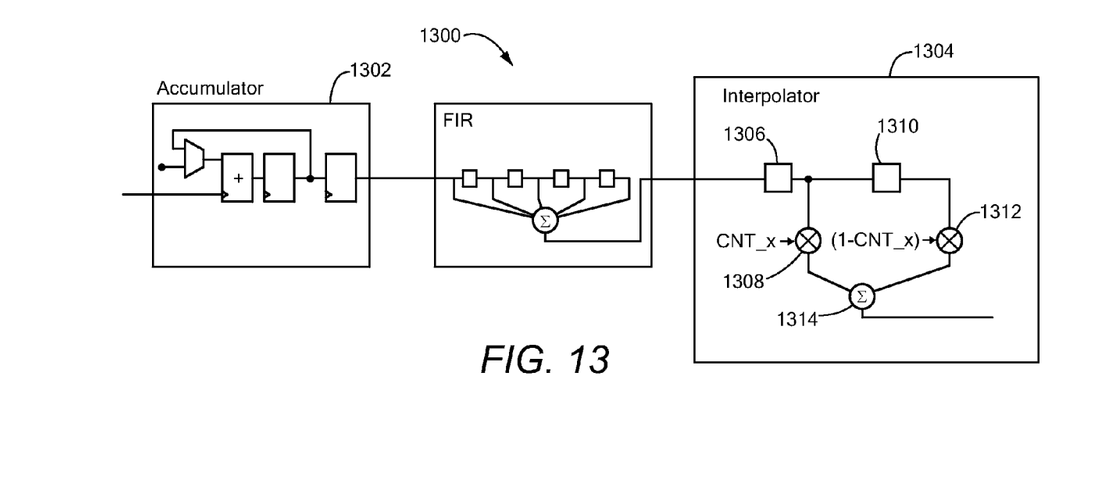
FIG. 13 is a block diagram of a simplified memory model constructed in accordance with principles of the present invention.

FIG. 13 is a simple implementation of the memory model of FIG. 12. In FIG. 13, the down-sampling block 1202 is replaced by an accumulator 1302. The accumulator 1302 is a conventional accumulator that includes a multiplexer, an adder and two registers, which function to down-sample the input signal. Also, the up-sampling block 1214 is replaced by an interpolator 1304. FIG. 13 shows a first order interpolator, but it is contemplated that higher order interpolators may be implemented. The interpolator 1304 has a first delay element 1306 and a first multiplier 1308 to multiply an output of the first delay element 1306 by a first factor. The interpolator 1304 also has a second delay element 1310 and a second multiplier 1312 to multiply an output of the second delay element 1310 by a second factor. An adder 1314 adds the output of the first multiplier to the output of the second multiplier. In one embodiment, the second factor is one minus the first factor. The CNT_X is a counter ranging from 0 to 1, incremented by $1/M_k$ per clock cycle, where $M_k$ is an integer up-sampling factor. The embodiment of FIG. 13 has an advantage of reduced complexity, resulting in less computation, less memory consumption and less cost, compared to an embodiment that uses more complex down-sampling and up-sampling.

Thus, one embodiment is a pre-distorter memory model having a plurality of branches with each branch receiving a different output basis function signal. At least one branch includes a down-sampler, a memory structure, and an up-sampler. The down-sampler down-samples the output basis function signal received at the branch by a down-sampling factor $1/M_k$, $M_k$ being different for each branch having a down-sampler. The down-sampler may include an accumulator and a register.

The memory structure receives and filters an output of the down-sampler. The memory structure may be an FIR filter and includes at least one delay element to delay the output of the down-sampler according to a predetermined delay. The predetermined delay may be different for each branch. The memory structure has an output that is based on an output of the at least one delay element.

The up-sampler up-samples the memory structure output by an up-sampling factor $M_k$. The up-sampler may be an interpolator that interpolates $M_k-1$ zeros between non-zero samples of the output of the memory structure.

At least one of the value of $M_k$, the number of delays of the memory structure, and the predetermined delay of a delay element may be based on an evaluation period associated with the branch. For example, the factor $M_k$ may be related to a number of delay elements in the memory structure of the branch. In particular, an increase in a number of delay elements of a branch may be associated with a decrease in the factor $M_k$ of the branch. Also, the factor $M_k$ may be related to an amount of delay of a delay element of the memory structure of the branch. In some embodiments, the factor $M_k$ may be related to a power of an output basis function received by the branch.

The present invention can be realized in hardware, or a combination of hardware and software. Thus, for example, the memory models of FIGS. 8-11 can be implemented as hardware elements, can be implemented in software, or in a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A pre-distorter memory modeling apparatus, comprising:
a plurality of branches, each branch receiving a different output basis function signal, at least one branch including:
a down-sampler, the down-sampler down-sampling the received output basis function signal received at the branch by a down-sampling factor of $1/M_k$, $M_k$ being different for each of the at least one branch and being based on an evaluation period associated with the corresponding each of the at least one branch; and
a memory structure, the memory structure receiving and filtering an output of the down-sampler, the memory structure including:
at least one delay element, at least one of the at least one delay element delaying the output of the down-sampler according to a corresponding pre-determined delay; and
a memory structure output based on an output of the at least one delay element; and
an up-sampler, the up-sampler up-sampling the memory structure output by an up-sampling factor equal to $M_k$.

2. The apparatus of claim 1, wherein the down-sampler includes an accumulator and a register, the accumulator and register cooperatively configured to low-pass filter and down-sample the received output basis function signal.

3. The apparatus of claim 1, wherein the up-sampler includes an interpolator configured to interpolate over $M_k-1$ zeros between non-zero samples.

4. The apparatus of claim 1, wherein the pre-determined delay is different for each branch.

5. The apparatus of claim 1, wherein an evaluation period associated with a first branch of the plurality of branches is on an order of nanoseconds and an evaluation period associated with a second branch of the plurality of branches is on an order of microseconds.

6. The apparatus of claim 1, wherein an evaluation period associated with a first branch of the plurality of branches is on an order of microseconds and an evaluation period associated with a second branch of the plurality of branches is on and order of milliseconds.

7. The apparatus of claim 1, wherein the factor $M_k$ is related to a number of delay elements in the memory structure of a corresponding branch of the plurality of branches.

8. The apparatus of claim 7, wherein an increase in a number of delay elements of the memory structure of a branch of the plurality of branches is associated with a decrease in the corresponding factor $M_k$ of the branch of the plurality of branches.

9. The apparatus of claim 1, wherein the factor $M_k$ is based on an exponential power associated with the output basis function signal received at the corresponding branch of the plurality of branches.

10. The apparatus of claim 9, wherein an increase in the exponential power associated with the output basis function is associated with a decrease in the factor $M_k$ of the corresponding branch of the plurality of branches.

11. A method of calculating a distortion signal, $d(n)$, the method comprising:
receiving an input signal, $x(n)$;
supplying the input signal, $x(n)$, to each of K branches, where K is an integer not less than 1;
in each of the K branches, operating on the input signal, $x(n)$, by a different basis function, to produce in each branch an output signal, $u_k(n)$, where $k=0$ to $K-1$; and
in each of the K branches, applying one of the K output signals, $u_k(n)$, to a different one of K memory models, each of the K memory models:
down-sampling the signal $u_k(n)$ by a factor $1/M_k$, to produce a down-sampled signal, $v_k(n)$ the factor $M_k$ of a branch of the K branches corresponding to an order of the basis function associated with the branch;
filtering the down-sampled signal $v_k(n)$ by a filter including at least one delay element to produce a filtered output;
up-sampling the filtered output by the factor, $M_k$, to produce a distortion component $d_k(n)$; and
adding the outputs $d_k(n)$ of each branch to produce the distortion signal $d(n)$.

12. The method of claim 11, wherein operating on the input signal by a basis function includes raising the input signal x(n) by an integer power, the integer denoting the order of the basis function.

13. The method of claim 11, wherein an amount of delay of a delay element is associated with an order of the basis function.

14. The method of claim 11, wherein the factor $M_k$ of a branch of the K branches is based on an evaluation period associated with the branch.

15. The method of claim 14, wherein an amount of delay provided by the filter is related to the factor $M_k$ of the corresponding branch.

16. A pre-distorter memory module, comprising:
- a combination of a register and an accumulator, the combination arranged to low-pass filter and down-sample an input signal;
- a filter comprising at least one delay element, the filter producing a filtered output;
- an interpolator, comprising:
    - a first delay element receiving the filtered output and producing a first delay element output;
    - a first multiplier, the first multiplier multiplying the first delay element output by a first factor, the first factor depending upon an up-sampling factor, $M_k$, $M_k$ being based on an evaluation period associated with the pre-distorter memory module;
    - a second delay element receiving the first delay element output and producing a second delay element output;
    - a second multiplier, the second multiplier multiplying the second delay element output by a second factor; and
    - an adder, the adder adding the output of the first multiplier and the second multiplier.

17. The pre-distorter of claim 16, wherein the second factor is one minus the first factor.

18. The pre-distorter of claim 16, wherein the first and second delay elements operate at a down-sampled rate of an output of the register.

* * * * *

UNITED STATES PATENT AND TRADEMARK OFFICE
CERTIFICATE OF CORRECTION

PATENT NO. : 8,731,105 B2
APPLICATION NO. : 13/529342
DATED : May 20, 2014
INVENTOR(S) : Bai

Page 1 of 1

It is certified that error appears in the above-identified patent and that said Letters Patent is hereby corrected as shown below:

In the claims,

In Column 14, Line 58, in Claim 11, delete "$V_k(n)$" and insert -- $V_k(n)$, --, therefor.

Signed and Sealed this
Eighth Day of March, 2016

Michelle K. Lee
*Director of the United States Patent and Trademark Office*